United States Patent [19]
Matsumoto et al.

[11] Patent Number: 5,340,621
[45] Date of Patent: Aug. 23, 1994

[54] PLASMA CVD METHOD

[75] Inventors: Minoru Matsumoto; Etsuo Ogino; Toshio Tsuno, all of Tsukuba, Japan

[73] Assignee: Nippon Sheet Glass Co., Ltd., Osaka, Japan

[21] Appl. No.: 35,672

[22] Filed: Mar. 23, 1993

[30] Foreign Application Priority Data

Mar. 30, 1992 [JP] Japan .................................. 4-074048

[51] Int. Cl.⁵ .............................................. B05D 3/06
[52] U.S. Cl. .................... 427/571; 427/255.2; 427/255.3; 427/294; 427/574; 427/580; 427/585; 427/598
[58] Field of Search ............ 427/571, 585, 598, 248.1, 427/294, 574, 580, 255.2, 255.3

[56] References Cited
FOREIGN PATENT DOCUMENTS 3-215671  9/1991  Japan .

OTHER PUBLICATIONS

"Vacuum (Shinku)", Joshin Uramoto, vol. 25, No. 10 (Jun. 1982), pp. 660–670.

*Primary Examiner*—Bernard Pianalto
*Attorney, Agent, or Firm*—Woodcock Washburn Kurtz Mackiewicz & Norris

[57] ABSTRACT

A plasma CVD method and the device for generating an arc discharging plasma, together with introducing both a material gas and a reactive gas into a vacuum chamber; coating a substrate with a thin film which contains a material gas component and a reactive gas component, said plasma CVD method comprising the steps of: introducing said material gas into a position between the arc discharging plasma and the substrate; and introducing said reactive gas into a space opposite, relative to the arc discharging plasma, to a side whereinto the material gas is introduced.

8 Claims, 4 Drawing Sheets

PLASMA CVD METHOD

BACKGROUND OF THE INVENTION

1. Field of the Invention

This invention relates to a method and a device for coating a substrate with a film. More particularly, this invention relates to a suitable method and device for coating a substrate with a thin film of an oxide of silicon, a nitride of silicon and an oxynitride of silicon.

2. Description of the Prior Art

The vacuum deposition method, the reactive sputtering method, the plasma CVD method and the like by which coating a substrate with the film is effected in a low pressure vacuum chamber, have been known as prior art. However, if a dielectric thin film of the silicon oxide film, the silicon nitride film, the silicon oxynitride film and the like, is to be formed, the plasma CVD method excels the other methods in film forming rate and in quality of the film.

The prior plasma CVD method was performed using the D.C. glow discharge, the high frequency glow discharge, the microwave discharge etc. as plasma sources. Incidentally the plasma density of the glow discharge is $10^8$ to $10^{11}$ ions/cm$^3$. Therefore, there is a problem that the plasma density is too small for increasing both the utilization efficiency (yield) of a material gas and the film forming rate. On the other hand, although a high density plasma may be generated by the microwave discharge, the microwave discharge is unsuitable for generating a spacious plasma whereby coating a spacious area substrate of, for example, approximately one square meter may be effected.

Nevertheless, a plasma CVD method where a magnetic field applying external means transforms this plasma into a sheet form, is disclosed in the Japanese Patent Tokkai Hei 3-215671 based on that the plasma density of an arc discharging plasma generated by a composite cathode type plasma gun described in "Vacuum (Shinku)" Vol. 25, No. 10 (1982), is as high as $10^{13}$ to $10^{14}$ ions/cm$^3$.

In the method which was disclosed in the Japanese Patent Tokkai Hei 3-215671, a pump capacity for exhausting the air from a vacuum chamber must be high since the size of a box type gas supplying nozzle equipped in the device is the same as the area of the plasma; therefore, the device is unfavorable due to its high price.

OBJECTS AND SUMMARY OF THE INVENTION

The aim of this invention is to offer a low cost arc discharging plasma CVD method and the device by which coating the substrate with an uniform film is effected with high degree of film forming rate.

The method of this invention is a plasma CVD method for generating a plasma in a plasma beam generating device using a discharging gas that is supplied into the plasma beam generating device, applying magnetic field directing from the plasma beam generating device to an anode opposed thereto by a magnetic field applying means, taking out the plasma from the plasma beam generating device by the magnetic field applying means, thereby, generating an arc discharging plasma at a position located between the plasma beam generating device and the anode in a vacuum chamber, and coating a substrate approximately parallel to the arc discharging plasma, with a thin film including a material gas component and a reactive gas component, said plasma CVD method comprising the steps of: introducing said material gas into a position between the arc discharging plasma and the substrate; and introducing said reactive gas into a position in a side opposite, with inserting the arc discharging plasma, to a side whereinto the material gas is introduced.

It is found that the forming of a coating film which is made from a reaction product, can be accelerated by the presence of a reactive gas which is activated by the arc discharging plasma and, moreover, it is found that the film forming rate of a coating film which is made from a reaction product, can be reduced by excitation/dissociation of the material gas molecule by the arc discharging plasma; based on these findings, this invention is accomplished.

If the substrate is coated with SiO$_2$ film using both SiH$_4$ gas as a material gas and gaseous oxygen as a reactive gas, the oxygen activated by the high density plasma will accelerate the forming rate of SiO$_2$ film, while excitation/dissociation of SiH$_4$ gas molecule will rather reduce the forming rate of SiO$_2$ film. Direct decomposition of SiH$_4$ by the plasma, will generate hydrogen as a byproduct; however, this is undesirable, because the generated hydrogen will cause increase in both the discharge voltage and the process pressure. The forming rate of the SiO$_2$ film will be approximately proportional to the amount of molecular oxygen passing through the high density sheet plasma, and will also increase with increasing discharge current generating the plasma. On the other hand, if both the amount of supplied oxygen and the value of the discharge current is held constant, respectively, there is a certain amount of supplied SiH$_4$ gas will give a maximum film forming rate; exceeding this amount of supplied SiH$_4$ gas will reduce the film forming rate. Therefore, increasing amount of supplied reactive gas under a constant amount of supplied material gas, will be able to form a film with a higher degree of both the film forming rate and the utilization efficiency (yield) of a material gas.

In this invention, the reactive gas molecules introduced from a reactive gas supplying nozzle which is installed in a side opposite to the side wherein the substrate is, with inserting the arc discharging plasma, will be excited by their collision with electrons or ions in the plasma during their passing through the high density plasma; they will reach the substrate in a state containing excited particles in high ratio; thereafter, they will react with the material gas molecules introduced from material gas supplying nozzle and thereby form the film.

It is preferable to use a lower pressure vacuum chamber in order to make the excited reactive gas molecules reach in the substrate with a high efficiency, since the lower pressure in the vacuum chamber in which the arc discharging plasma is formed, will reduce both the scattering of excited molecules and the loss of excitation energy that are caused by intermolecular collision of the excited reactive gas molecules. The pressure in that moment should be 5 Pa (pascal) or thereunder, more preferably, 0.5 Pa or thereunder. And if a spacious substrate is coated with the film, a plurality of the sheet plasma should be arranged such that a more spacious integrated sheet plasma can be obtained with a large surface area on the sheet.

For example, silane and the derivative thereof such as SiH$_4$, Si$_2$H$_6$, SiCl$_4$, and the like, or, GeH$_4$, B$_2$H$_6$, or hydrocarbons and the like can be used as the material gas of this invention. For example, oxygen, $N_2O$, nitrogen, $NH_3$, hydrogen, $H_2O$, $CO_2$, and the like can be used as the reactive gas. The reactive gas that will not precipitate solid matters even after the excitation by the plasma, is preferable for an efficient recovery of the excited particles on the substrate. Particularly, if the substrate is coated with the $SiO_2$ film, both $SiH_4$ as the material gas and oxygen as the reactive gas should preferably be used for obtaining both a higher degree of the film forming rate and a higher quality of the film.

The composite cathode type plasma generator described in "Vacuum (Shinku)" Vol. 25 No. 10 (1982), or a pressure gradient type plasma generator, or a plasma generator with combined features of them, can be used as the arc discharging plasma generator for this invention.

In a preferred embodiment, the composite cathode type plasma generator comprises a small heat capacity auxiliary cathode and a $LaB_6$ master cathode; in this generator, a discharging gas is introduced through a discharging gas inlet, initial discharge is concentrated to abovementioned auxiliary cathode, thereby the master cathode is heated, and arc discharge from the master cathode as a terminal cathode is thus performed.

Further, in another preferred embodiment, in the pressure gradient type plasma generator a midway electrode is located between a cathode and an anode, approximately 130 Pa is maintained in the cathode region and approximately 0.4 Pa in the anode region for the discharge; this type of the generator has the advantages that damages of the cathode by the back flow of ions from the anode region will be prevented and, moreover, heavy-current discharge can be performed because of far higher degree of efficiency of the ionization for generating discharging electron beam than that of the device without the midway electrode.

The plasma generator with combined features of the composite cathode type plasma generator with the pressure gradient type plasma generator, namely a plasma generator having the composite cathode as the cathode and being equipped with the midway electrode has the abovementioned advantages at the same time and, therefore, is particularly preferable as a plasma generator to be used in this invention.

Single gas such as hydrogen, argon, helium, as well as their mixture can be used as the discharging gas to be introduced into the generator of the arc discharging plasma.

In this invention, the film forming is performed such that the material gas molecule is activated using the excited particle of the reactive gas. The density of electrons of the plasma for exciting of the reactive gas is preferably $10^{11}$ ions/$cm^3$ or more in the center part thereof, more preferably $10^{13}$ ions/$cm^3$ or more. Further, the average electron energy in the center part is preferably 5 eV or more, more preferably 10 eV or more. If nearly all the reactive gas molecules pass through the region where the arc discharging plasma is present, and arrive at the substrate; greater flux of the reactive gas containing excited particles in high ratio can be generated. Further, by keeping the pressure in the vacuum chamber below 5 Pa the flux of excited particles of the reactive gas is transported to the vicinity of the substrate with almost no scattering nor loss of excitation energy by collision of excited molecules, thereby, increasing the film forming rate. In addition, since the reactivity of the active particle of the reactive gas molecule is maintained in such a high degree that the reactivity of the material gas molecule activated thereby is sufficiently high, the substrate can be coated with a high quality film, without heating the substrate to high temperature.

The second point of this invention is that a plasma CVD device comprising: a) a low pressure vacuum chamber wherein pressure reduced atmosphere is adjustable; b) a plasma beam generating device and an anode provided in a wall of the low pressure vacuum chamber as opposed to the anode in the wall; c) a plasma generating means to generate the plasma in the plasma beam generating device; d) a plasma generating means to take out the plasma from the plasma beam generating device toward the anode in the vacuum chamber and then to make an arc discharging plasma out of this plasma; e) a material gas supplying means and a reactive gas supplying means provided in the vacuum chamber; and f) a substrate holding, means to hold the substrate in parallel with the arc discharging plasma, wherein said material gas supplying means is provided at the side of the substrate relative to the arc discharging plasma while said reactive gas supplying means provided at the side opposite to the side of the substrate.

In such a plasma CVD method of this invention, presence of the reactive gas activated by the arc discharging plasma will increase the film forming rate of the film composed of reaction products, while excitation/dissociation of the material gas molecule will rather reduce the film forming rate of the film composed of reaction products. In this invention, since the material gas is introduced to the vicinity of the substrate, the rate of the flux of the material gas molecule arriving at the substrate can be increased and, moreover, the amount of the material gas molecule passing through the arc discharging plasma is reduced. Therefore, the amount of the material gas molecule contributing to the film forming will be increased and, moreover, both the film forming rate and the utilization efficiency of a material gas will be increased.

Further, dissipation of the material gas molecule without arriving at the substrate can be suppressed, since a distance as necessary to introduce the material gas to the substrate can be shortened thereby the utilization efficiency (yield) of a material gas will be increased. Supplying the material gas from a position located near to the substrate will enable an uniform distribution of the material gas near to the substrate with relative ease, thereby, whether the substrate is spacious, or whether the substrate has a curved surface, an uniform thickness of the film coated on the substrate can be obtained easily.

In this invention, the substrate can be coated with a very uniform film in thickness, with high degree of the film forming rate, and with high degree of the utilization efficiency (yield) of a material gas. Particularly, if the substrate is coated with the film while the substrate is moved in the direction from the cathode to the anode or the reverse, the substrate can be coated with the film with high degree of the film forming rate and with high degree of the utilization efficiency (yield) of a material gas. Therefore, the spacious substrate can be coated with the film with high degree of efficiency.

DETAILED DESCRIPTION OF THE PREFERRED EMBODIMENT

Described below are several embodiments of this invention; however, this invention should not be interpreted restrictedly by these embodiments.

Figure 1:
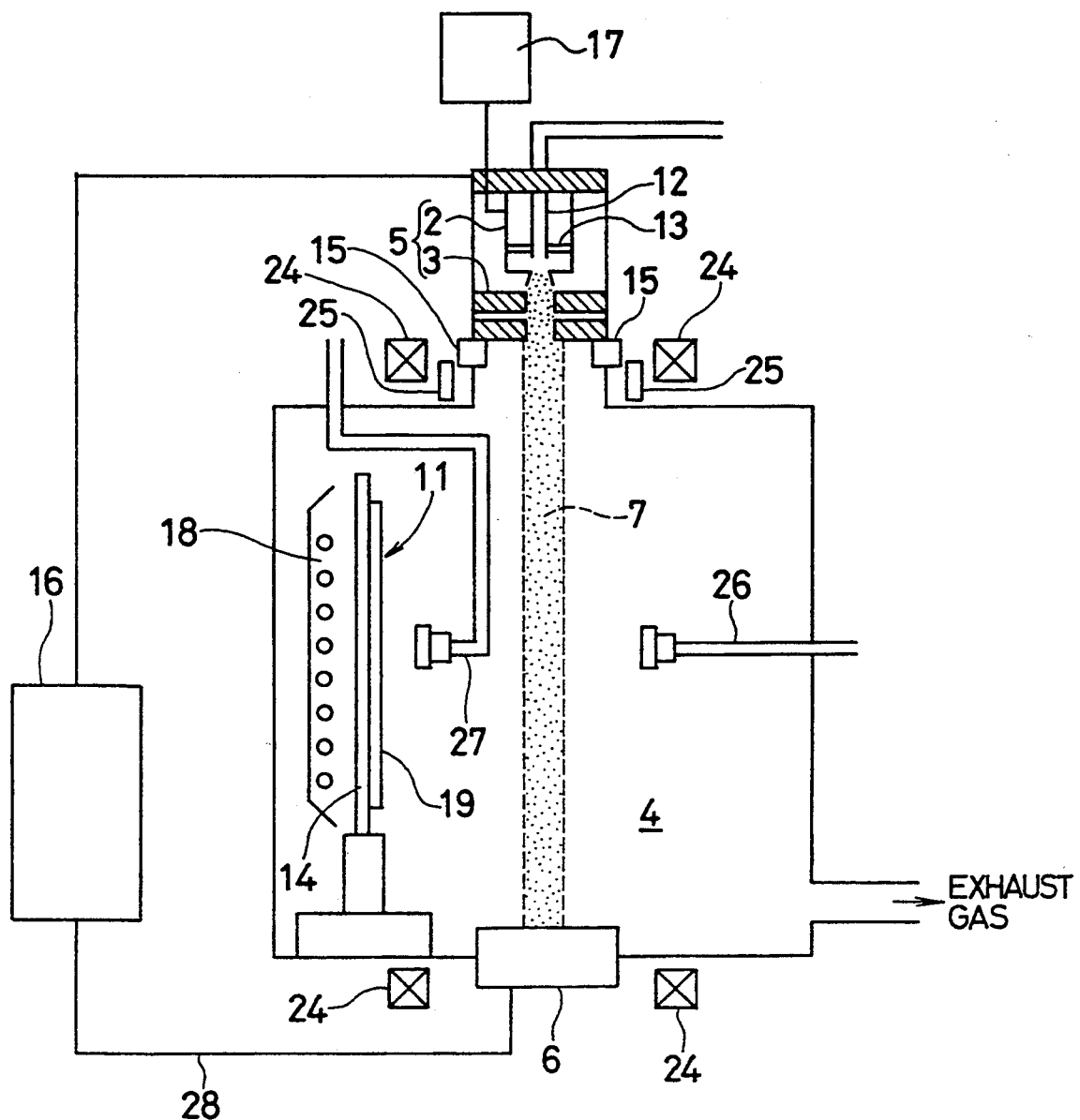
FIG. 1 is a cross-sectional view of the plasma CVD device as an embodiment of this invention.

As is shown in FIG. 1, the material gas supplying nozzle 27 is located in a position between the sheet plasma 7 and the substrate 11 approximately parallel thereto. The reactive gas supplying nozzle 26 is installed in the opposite side to the side where the material gas supplying nozzle 27 is located with the sheet plasma 7 between both nozzles. The material gas supplying nozzle 27 together with means for fixing it, are formed to a dimension and a shape whereby the gas stream from below can not be prevented and the conductance of the vacuum chamber 1 can not be reduced. The reactive gas supplying nozzle 26 together with means for fixing it, must be also shaped to a dimension and a shape whereby the conductance of the vacuum chamber 1 can not be reduced. Further, the respective distances from the sheet plasma 7 to the reactive gas supplying nozzle 26 and to the material gas supplying nozzle 27 needs not be restricted, if it is adjusted such that the nozzles are not damaged with a thermal stress and the gases are not decomposed in the nozzles. The respective number of the reactive gas supplying nozzles 26 and the material gas supplying nozzles 27 may be one or more in order to obtain an uniform thickness of the coating film. Their number can optionally be varied depending on the respective distances from the substrate 11 to the gas supplying nozzle 26 and 27 and on the flow rate of the supplied gas. Exhaust nozzles of both the reactive gas supplying nozzle 26 and the material gas supplying nozzle 27 are directed to the surface 19 of the substrate 11; the number and the bore of them are determined in order to obtain an uniform fluxes (flow irate) of the material gas and the reactive gas on the surface 19.

The pressure gradient type plasma generator 5 is installed in the wall of the vacuum chamber 1. A plasma beam generating cathode 2 and the tantalum anode 6 are installed in the pressure reduced vacuum chamber 1, such that they are placed opposite to each other with an electric insulator 15 between both electrodes. Further, the electrodes 2 and 6 are formed so as to be connected to a heavy-current discharging D.C. power source 16 by means of a connecting wire 28. The plasma beam generating cathode 2 is a hollow cathode type discharging electrode which comprises a tantalum pipe 12 and a disc-shaped electrode 13 of $LaB_6$. The discharging gas of an inert gas or of a mixture of an inert gas with hydrogen is introduced through the tantalum pipe 12 into the vacuum chamber inside 4; thereafter, electric potential difference applied between the plasma beam generating cathode 2 and an electron accelerating electrode 3 takes out electrons which are generated by supplying the D.C. power from an external power source 17 to the cathode 2, thereby, a low voltage heavy current plasma is generated between the plasma beam generating cathode 2 and the anode 6. By then, the electrons have been accelerated by the electron accelerating electrode 3.

By a magnetic field applying means comprising both a plasma inductive coil 24 and a couple of a plasma compressive permanent magnet 25 where its N magnetic poles are placed opposite to each other, the plasma taken out to the vacuum chamber inside 4 is transformed into a thin plane shaped, sheet like plasma spreading parallel to the substrate 11. A plasma generating means comprises the magnetic field applying means and the discharging power source 16.

Figure 3:
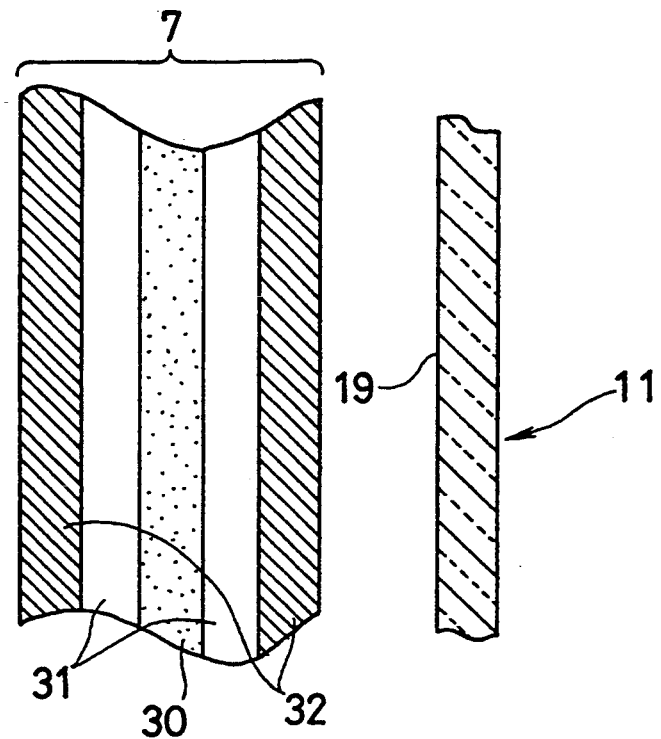
FIG. 3 is a schematic view for explaining the characteristics in the direction of thickness of the arc discharging sheet plasma according to this invention.

As is shown in FIG. 3, potential distribution in the thickness direction of the sheet plasma 7 has a layer structure having three different regions. In the center thereof, there is a plasma electron beam 30 which has a high-energy electron beam corresponding to an optionally determined electric potential difference between the plasma beam generating cathode 2 and the midway electrode. In both sides thereof, hot plasmas 31 being approximately 10 eV in the electron temperature, are formed. Further, in the utmost external layer, cold plasmas 32 being approximately several eV in the electron temperature, are formed.

Figure 2:
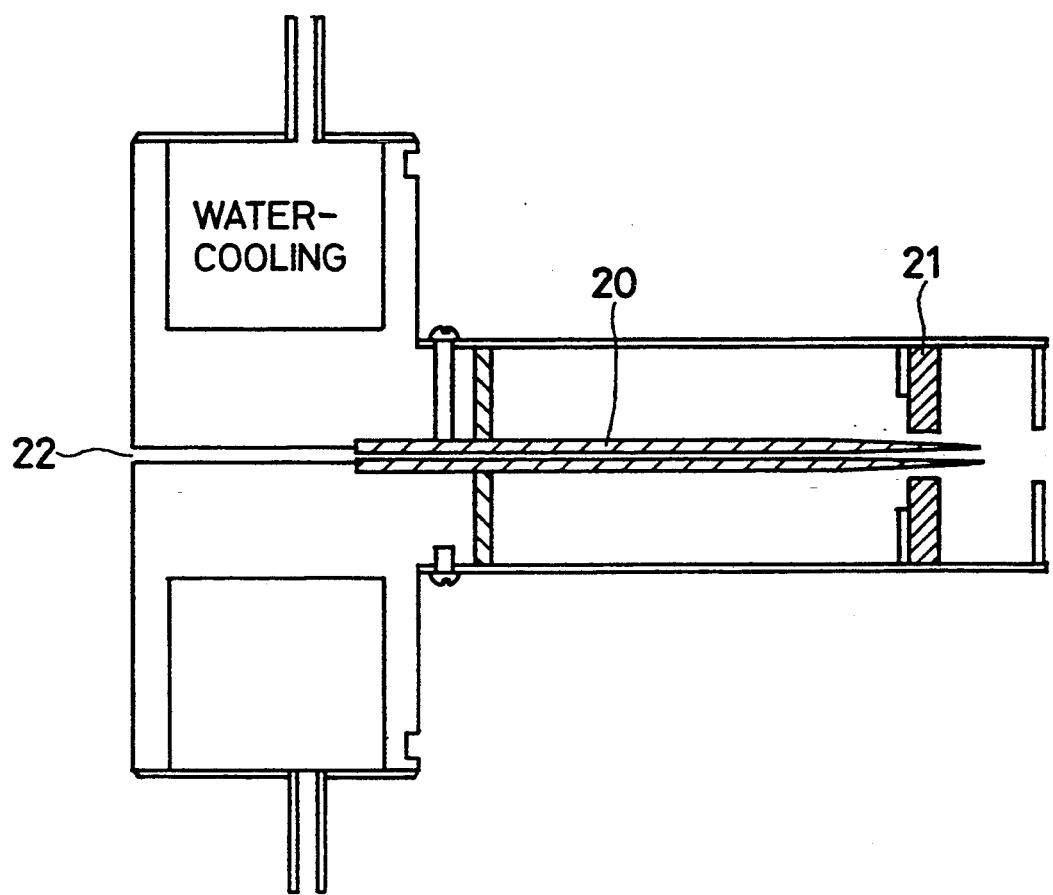
FIG. 2 is a schematic cross-sectional view of the composite cathode that can be used as the cathode of the plasma beam generating device of this invention.

As is shown in FIG. 2, the composite cathode type plasma generator comprising the small heat capacity auxiliary cathode 20 and the $LaB_6$ master cathode introduces the discharging gas from a discharging gas inlet 22 and concentrates initial discharge to abovementioned auxiliary cathode 20 thereby heats the master cathode and thus performs arc discharge from the master cathode 21 as terminal cathode.

For example, $SiH_4$ as the material gas to be used to form thin films of an oxide of silicon, a nitride of silicon and an oxynitride of silicon is supplied from the material gas supplying nozzle 27 located between the substrate 11 and the sheet plasma 7. On the other hand, gaseous oxygen, gaseous nitrogen and the like as the reactive gas is supplied from the reactive gas supplying nozzle 26 which is located at a side position opposite to the side where the material gas supplying nozzle 27 is located with the arc discharging plasma between both nozzles.

Figure 4:
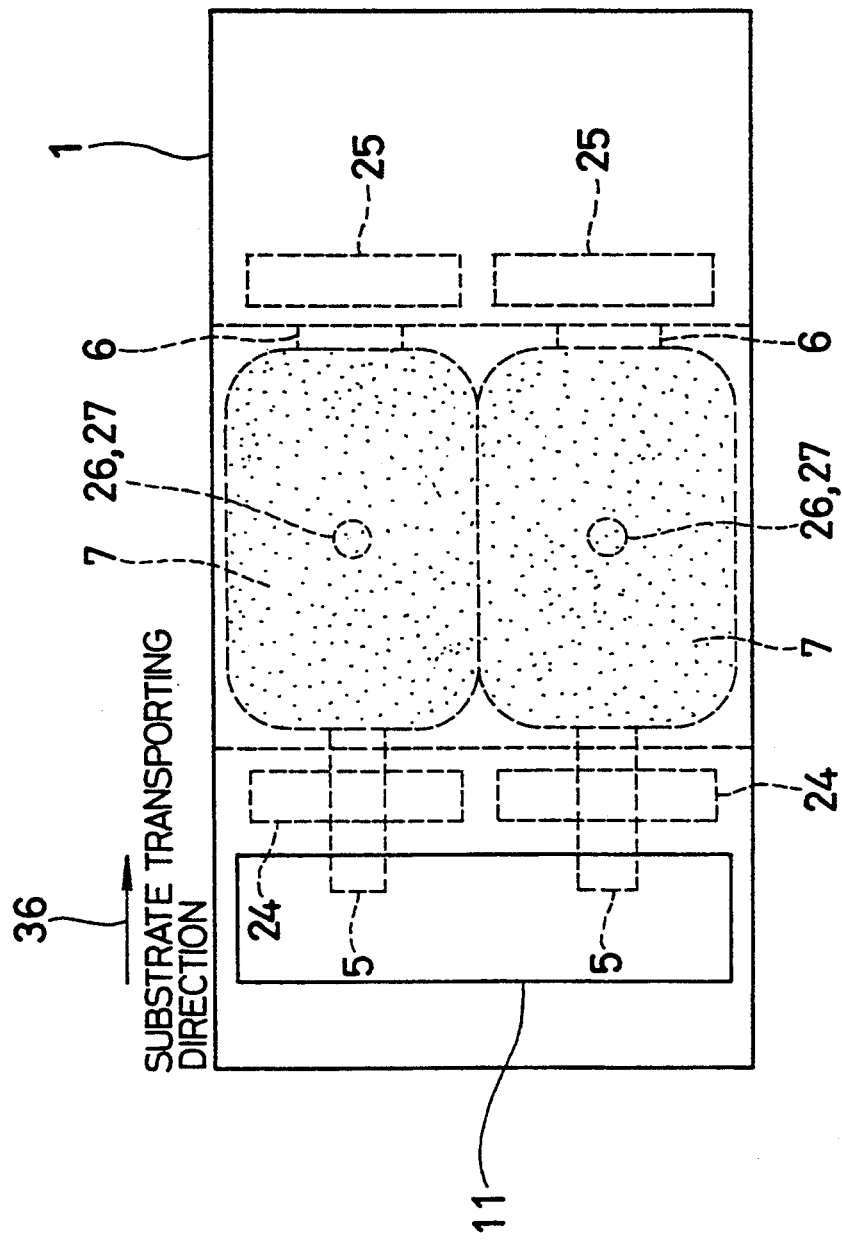
FIG. 4 is a partial plan view of a plasma CVD device as another embodiment of this invention.
Figure 5:
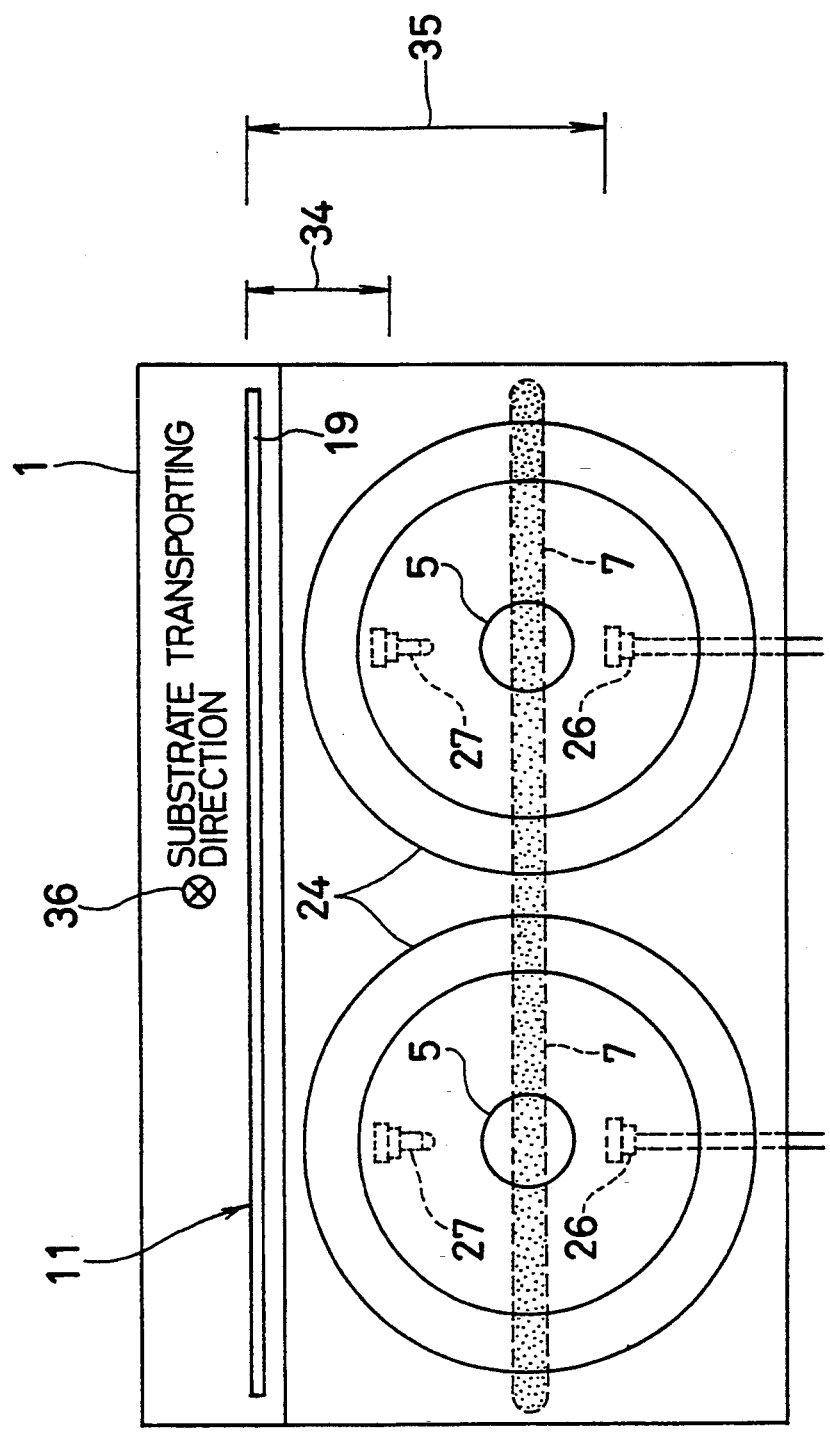
FIG. 5 is a partial cross-sectional view of a plasma CVD device as another embodiment of this invention.

In further embodiment shown in FIG. 4 and FIGURE 5, the pressure gradient type plasma generator 5, the plasma inductive coil 24, the plasma compressive permanent magnet 25, the reactive gas supplying nozzle 26 and the material gas supplying nozzle 27 are installed in two couples each. In this embodiment, two sheet plasmas 7 are generated such that their sheet surfaces are arranged side by side; this device is to coat the substrate 11 with the film while transporting the substrate 11 in the longitudinal direction (the substrate transporting direction 36 shown in the FIGURES). In this embodiment, the substrate 11 and the reactive gas supplying nozzle 26 are located with the sheet plasmas 7 between them; the distance of between them is indicated by 35. The material gas supplying nozzle 27 is located between the substrate 11 and the sheet plasmas 7; the distance 34 of between the substrate 11 and the material gas supplying nozzle 27 is regulated to be shorter than the distance 35. By this structure, to forming the film on a spacious area substrate is feasible whose area is approximately one square meter or more.

A $SiO_2$ film was formed on a glass board using the device shown in FIG. 1. The material gas supplying nozzle 27 was located at a position by 190 mm from the vicinity of the center above the sheet plasma 7 which was 400 mm wide, 600 mm long and several tens mm thick; on the other hand, the reactive gas supplying nozzle 26 was located at a position by 100 mm below the sheet plasma 7 near the center; and four sheets of a 100 mm square glass board were installed at a substrate maintaining holder 14 which is at a distance of 400 mm from the plasma.

The substrate 11 was heated to approximately 250° C. with a heater 18; thereafter, under the condition where abovementioned plasma had been generated, $SiH_4$ was introduced at a rate of 300 sccm through the material gas supplying nozzle 27, and oxygen was introduced at a rate of 500, 750, or 1000 sccm through the reactive gas supplying nozzle 26, with 3 variations in the level of oxygen as above. The material gas and the reactive gas were allowed to flow during a constant period of time, thereafter, discharging were stopped and samples C, D, E were obtained by taking out the substrate 11 from the vacuum chamber 1. It was found that the film forming rate of forming $SiO_2$ film on the substrate 11 is such as is indicated in TABLE 1. These thin films were investigated on optical constants by ellipsometer; at 633 nm of the wave length, the refractive indices were found to be 1.43 to 1.47 and the extinction coefficients of all samples were found to be 0.00, that is, no absorption at all was observed which implies that those samples were transparent.

TABLE 1

| | comparative examples | |
|---|---|---|
| sample A | $SiH_4$ flow rate (SCCM): | 300 |
| | oxygen flow rate (SCCM): | 600 |
| | film forming rate (nm. m/min): | 50 |
| | *ratio of film forming rate: | 1.00 |
| sample B | $SiH_4$ flow rate (SCCM): | 300 |
| | oxygen flow rate (SCCM): | 900 |
| | film forming rate (nm. m/min): | 56 |
| | *ratio of film forming rate: | 1.12 |
| | embodiments | |
| sample C | $SiH_4$ flow rate (SCCM): | 300 |
| | oxygen flow rate (SCCM): | 500 |
| | film forming rate (nm. m/min): | 85 |
| | *ratio of film forming rate: | 1.7 |
| sample D | $SiH_4$ flow rate (SCCM): | 300 |
| | oxygen flow rate (SCCM): | 750 |
| | film forming rate (nm. m/min): | 132 |
| | *ratio of film forming rate: | 2.64 |
| sample E | $SiH_4$ flow rate (SCCM): | 300 |
| | oxygen flow rate (SCCM): | 1000 |
| | film forming rate (nm. m/min): | 166 |
| | *ratio of film forming rate: | 3.32 |

*The ratio of film forming rate is obtained with sample A as a standard.

COMPARATIVE EXAMPLES

Both the reactive gas supplying nozzle 26 and the material gas supplying nozzle 27 are located at a position opposite to the side where the substrate 11 is located, with the sheet plasma 7 between both nozzles and the substrate; this device was used as a plasma CVD device for comparison. The material gas and the reactive gas were introduced from a gas supplying nozzle 26, 27 located in a position which is below the sheet plasma at a distance of 100 mm; thereafter samples A, B were obtained by forming a $SiO_2$ film on a glass substrate 11.

As is indicated in TABLE 1, the film forming rate of the embodiments was increased several times as much as film forming rate of the comparative examples was, thereby, it was confirmed that the utilization efficiency (yield) of $SiH_4$ as the material gas was increased.

What is claimed is:

1. A method of generating plasma CVD using a plasma beam generating cathode and an anode located opposite the plasma generating cathode in a substantially vacuum chamber, a sheet plasma connecting the plasma generating cathode and the anode and dividing the vacuum chamber into a first subsection and a second subsection, a substrate being disposed in the first subsection of the vacuum chamber, a material gas supplying nozzle being placed between the sheet plasma and the substrate in the first subsection, a reactive gas supplying nozzle being placed in the second subsection of the vacuum chamber, the method comprising the steps of:
   a) supplying a discharging gas to the plasma generating cathode;
   b) applying magnetic field at the plasma generating cathode for generating an arc discharging plasma at a low voltage with heavy current along the sheet plasma;
   c) providing a material gas through the material gas supplying nozzle in the first subsection of the vacuum chamber;
   d) providing a reactive gas through the reactive gas supplying nozzle in the second subsection of the vacuum chamber; and
   e) coating the substrate substantially parallel to the arc discharging plasma with a thin film which includes at least the material gas and the reactive gas.

2. The plasma CVD method of claim 1, wherein said discharging gas comprises inert gas.

3. The plasma CVD method of claim 1, wherein said discharging gas comprises inert gas and hydrogen.

4. The plasma CVD method of claims 1, 2, or 3, wherein further comprising the steps of:
   i) introducing said material gas and said reactive gas to a thin film coating surface of said substrate, and
   ii) providing a passage of said reactive gas through said arch discharging plasma.

5. The plasma CVD method of claim 1, 2, or 3, wherein further comprising the step of:
   transforming said plasma into sheet by said magnetic field applying means and, moreover, paralleling a sheet surface thereof to said thin film coating surface of said substrate.

6. The plasma CVD method of claim 1 wherein said material gas consists of at least one substance selected from the group consisting of silane and silane derivatives $GeH_4$ $B_2H_6$, and hydrocarbons.

7. The plasma CVD method of claim 1 wherein silane and silane derivatives comprises at least one substance selected from the group consisting of $SiH_4$, $Si_2H_6$, and $SiCl_4$.

8. The plasma CVD method of claim 1, wherein said reactive gas contains at least one substance selected from the group consisting of oxygen, $N_2O$, nitrogen, $NH_3$, hydrogen, $H_2O$, and $CO_2$.

* * * * *